(12) United States Patent
Gaudiana et al.

(10) Patent No.: US 7,772,485 B2
(45) Date of Patent: *Aug. 10, 2010

(54) POLYMERS WITH LOW BAND GAPS AND HIGH CHARGE MOBILITY

(75) Inventors: Russell Gaudiana, Merrimack, NH (US); Richard Kingsborough, North Chelmsford, MA (US); David Waller, Lexington, MA (US); Zhengguo Zhu, Cambridge, MA (US)

(73) Assignee: Konarka Technologies, Inc., Lowell, MA (US)

( * ) Notice: Subject to any disclaimer, the term of this patent is extended or adjusted under 35 U.S.C. 154(b) by 635 days.

This patent is subject to a terminal disclaimer.

(21) Appl. No.: 11/375,643

(22) Filed: Mar. 14, 2006

(65) Prior Publication Data

US 2007/0014939 A1 Jan. 18, 2007

Related U.S. Application Data (60) Provisional application No. 60/699,123, filed on Jul. 14, 2005.

(51) Int. Cl.
*C07D 403/04* (2006.01)
*H01L 29/12* (2006.01)

(52) U.S. Cl. .................. 136/252; 136/263; 252/500; 546/47; 546/48; 549/448

(58) Field of Classification Search ................ 136/252, 136/263; 252/299.3, 61, 62; 549/34, 35, 549/43, 46, 47, 48

See application file for complete search history.

(56) References Cited

U.S. PATENT DOCUMENTS

| | | | |
|---|---|---|---|
| 4,292,092 A | 9/1981 | Hanak | |
| 4,416,959 A | 11/1983 | Skotheim | |
| 4,574,160 A | 3/1986 | Cull et al. | |
| 4,639,328 A | 1/1987 | Krause et al. | |
| 4,686,323 A | 8/1987 | Biter et al. | |
| 4,746,618 A | 5/1988 | Nath et al. | |
| 4,913,744 A | 4/1990 | Hoegl et al. | |
| 4,948,436 A | 8/1990 | Juergens | |
| 5,071,490 A | 12/1991 | Yokota et al. | |
| 5,221,363 A | 6/1993 | Gillard | |
| 5,274,058 A | 12/1993 | Ferraris et al. | |
| 5,510,438 A | 4/1996 | Ferraris et al. | |
| 5,536,808 A | 7/1996 | Curtis et al. | |
| 5,708,130 A | 1/1998 | Woo et al. | |
| 6,109,330 A | 8/2000 | Crisp | |
| 6,132,585 A | 10/2000 | Midorikawa et al. | |
| 6,188,175 B1 | 2/2001 | May et al. | |
| 6,198,091 B1 | 3/2001 | Forrest et al. | |
| 6,198,092 B1 | 3/2001 | Bulovic et al. | |
| 6,239,355 B1 | 5/2001 | Salafsky | |
| 6,278,055 B1 | 8/2001 | Forrest et al. | |
| 6,297,495 B1 | 10/2001 | Bulovic et al. | |
| 6,333,458 B1 | 12/2001 | Forrest et al. | |
| 6,352,777 B1 | 3/2002 | Bulovic et al. | |
| 6,353,083 B1 | 3/2002 | Inbasekaran et al. | |
| 6,399,224 B1 | 6/2002 | Li | |
| 6,440,769 B2 | 8/2002 | Peumans et al. | |
| 6,451,415 B1 | 9/2002 | Forrest et al. | |
| 6,464,762 B1 | 10/2002 | Arao | |
| 6,580,027 B2 | 6/2003 | Forrest et al. | |
| 6,657,378 B2 | 12/2003 | Forrest et al. | |
| 6,772,817 B2 | 8/2004 | Lai et al. | |
| 6,818,260 B2 | 11/2004 | Farrand et al. | |
| 6,864,333 B2 | 3/2005 | Dall'Occo et al. | |
| 7,095,044 B2 | 8/2006 | Brown et al. | |
| 7,105,237 B2 | 9/2006 | Sotzing | |
| 7,196,366 B2 | 3/2007 | Forrest et al. | |
| 7,309,833 B2 * | 12/2007 | Robeson et al. ............. 136/263 |
| 7,368,510 B2 * | 5/2008 | Lee et al. ..................... 525/355 |
| 7,405,775 B2 * | 7/2008 | Nilsson ....................... 349/43 |
| 2002/0040728 A1 | 4/2002 | Yoshikawa | |
| 2003/0008172 A1 | 1/2003 | Leclerc et al. | |
| 2003/0023029 A1 | 1/2003 | Wang et al. | |
| 2003/0036612 A1 | 2/2003 | Nifant'ev et al. | |
| 2003/0102024 A1 | 6/2003 | Zeira et al. | |
| 2003/0127967 A1 | 7/2003 | Tsutsui et al. | |
| 2003/0175411 A1 | 9/2003 | Kodas et al. | |

(Continued)

FOREIGN PATENT DOCUMENTS

| | | |
|---|---|---|
| DE | 31 21 350 | 7/1982 |
| DE | 103 26 547 | 1/2005 |
| DE | 69330835 | 2/2007 |
| EP | 0 251 598 | 1/1988 |
| EP | 1 065 725 | 1/2001 |
| EP | 1318553 | 6/2003 |
| EP | 1562154 | 8/2005 |
| JP | 04-192376 | 7/1992 |
| JP | 05-011841 | 1/2005 |
| WO | WO 94/14199 | 6/1994 |

(Continued)

OTHER PUBLICATIONS

Coppo et al., Cyclopentadithiophene based electroactive materials, Journal of Materials Chemistry, Jan. 21, 2005.*

(Continued)

*Primary Examiner*—Jennifer K Michener
*Assistant Examiner*—Matthew T Martin
(74) *Attorney, Agent, or Firm*—Fish & Richardson P.C.

(57) ABSTRACT

This disclosure relates to a polymer containing a first comonomer repeat unit and a second comonomer repeat unit different from the first comonomer repeat unit. The first comonomer repeat unit includes a cyclopentadithiophene moiety. The polymer can be used as a photoactive material in a photovoltaic cell. This disclosure also relates to such photovoltaic cells, as well as modules containing such photovoltaic cells.

20 Claims, 1 Drawing Sheet

U.S. PATENT DOCUMENTS

| | | | |
|---|---|---|---|
| 2003/0188777 | A1 | 10/2003 | Gaudiana et al. |
| 2003/0189402 | A1 | 10/2003 | Gaudiana et al. |
| 2003/0230335 | A1 | 12/2003 | Tsukahara |
| 2004/0187911 | A1 | 9/2004 | Gaudiana et al. |
| 2004/0192871 | A1 | 9/2004 | Wang et al. |
| 2004/0201018 | A1 | 10/2004 | Yamahara et al. |
| 2004/0256615 | A1* | 12/2004 | Sirringhaus et al. ........... 257/40 |
| 2005/0022865 | A1 | 2/2005 | Robeson et al. |
| 2005/0145972 | A1 | 7/2005 | Fukuda et al. |
| 2006/0027834 | A1 | 2/2006 | Forrest et al. |
| 2006/0155106 | A1 | 7/2006 | Roberts et al. |
| 2007/0120045 | A1 | 5/2007 | Yokoyama |
| 2007/0181179 | A1 | 8/2007 | Brabec et al. |
| 2007/0193621 | A1 | 8/2007 | Brabec et al. |
| 2008/0053518 | A1 | 3/2008 | Change et al. |

FOREIGN PATENT DOCUMENTS

| | | |
|---|---|---|
| WO | WO 97/05184 | 2/1997 |
| WO | WO 00/11725 | 3/2000 |
| WO | WO 00/22682 | 4/2000 |
| WO | WO 00/46321 | 8/2000 |
| WO | WO 02/059121 A1 | 8/2002 |
| WO | WO 02/101838 | 12/2002 |
| WO | WO 03/065462 | 8/2003 |
| WO | WO 2004/042824 | 5/2004 |
| WO | WO 2007/022226 | 2/2007 |
| WO | WO 2007/121252 | 10/2007 |
| WO | WO 2007/133705 | 11/2007 |

OTHER PUBLICATIONS

Sensfuss et al., Characterisation of potential donor acceptor pairs for polymer solar cells by ESR, optical, and electrochemical investigations.*

Gadisa et al., "Improvements of fill factor in solar cells based on blends of polyfluorene copolymers as electron donors," Thin Solid Films, 515:3126-3131, (2007).

Kim et al., "Influence of electron-donating polymer addition on the performance of polymer solar cells," J. Phys. D: Appl. Phys., 41:1-5, (2008).

Winder et al., "Sensitization of low bandgap polymer bulk heterojunction solar cells," Thin Solid Films, 403-404:373-379, (2002).

Wong et al., "Efficient photovoltaic cells with wide photosensitization range fabricated from rhenium benzathiazole complexes," App. Phys. Letters, 90:1-3, (2007).

Ohshita et al., "Synthesis of Polymers Composed of Alternating Diphenylenedithienosilole and Diethynylenesilyene Units and Their Applications to Hole Transport in Double-Layer EL Devices" Macromolecules, vol. 33, pp. 8890-8893 , 2000. Entire document, especially Scheme 1, p. 8890; Table 2.

Huang et al., "In-situ conductivity of a low band-gap conducting polymer. Measurement of intrinsic Conductivity," Acta Polymerica, vol. 48(10), (1997).

Huang et al., "A Donor-Acceptor Conducting Copolymer with a Very Low Band Gap and High Intrinsic Conductivity," Chem. Mater., vol. 10, No. 8, pp. 2212-2216, (1998).

Huang et al., "Oxygen-Modified Poly(4-dicyanomethylene-4H-cyclopenta[2,1-b;3,4-b]dithiophene: A Tunable Low band Gap Polymer," Chem. Mater., vol. 11, No. 6, pp. 1541-1545, (1999).

Ko et al., "Electrochemistry and electrochromism of a poly(cyclopentadithiophene) derivative with a viologa pendant," Electrochimica Acta. vol. 48, pp. 4127-4135, (2003).

Wu et al., "Low band gap-conjugated polymer derivatives," Synthetic Metals. vol. 155, pp. 618-622 (2005).

Yoon et al., "Organic Thin-Film Transistors Based on Carbonyl-Functionalized Quaterthiophenes: High Mobility N-Channel Semiconductors and Ambipolar Transport," J. Am. Chem. Soc. vol. 127, pp. 1348-1349, (2005).

Asawapirom et al., "Dialkylcyclopentadithiophene Polymers and Copolymers," Macromolecular Rapid Communications, 22:746-749, 2001.

Bakhshi et al., "Strategies for Molecular Designing of Novel Low-Band-Gap Electrically Conducting Polymers," Applied Biochemistry and Biotechnology, 96:125-133, 2001.

Bakhshi et al., "Electronic Structures of Donor-Acceptor Polymers Based on Polythiophene, Polyfuran and Polypyrrole," Molecular Engineering, 6:239-248, 1996.

Bakhshi et al., "Ab initio study of the electronic structures and conduction properties of some donor-acceptor polymers and their copolymers," Journal of Chemical Physics, 119:13159-13169, 2003.

Berlin et al., "Self-assembly of mono- and multilayers of polyconjugated conducting polymers," Macromolecular Rapid Communications, 21:301-318, 2000.

Berlin et al., "Thiophene/Cyclopentadiene Regular Copolymers from Electrochemical Oxidation of Dithienylcyclopentadienes," Macromolecular Chemistry and Physics, 203:1228-1237, 2002.

Coppo et al., "Cyclopentadithiophene based electroactive materials," J. Mater. Chem., 15:1123-1133, 2005.

Coppo et al., "Investigation of the electronic properties of cyclopentadithiophene polymers and copolymers," Mat. Res. Soc. Symp. Proc., 771:L4.9.1-L4.9.4, 2003.

Coppo et al., "Synthesis, solid state structure and polymerisation of a fully planar cyclopentadithiophene," Chem. Commun., 2548-2549, 2003.

Coppo et al., "Synthetic Routes to Solution-Processable Polycyclopentadithiophenes," Macromolecules, 35:2705-2711, 2003.

Cravino et al., "Nanostructured Bipolar Organic Polymers," Encyclopedia of Nanoscience and Nanotechnology, 7:615-628.

Cravino et al., "Double-cable polymers for fullerene based organic optoelectronic applications," J. Mater. Chem., 12:1931-1943, 2002.

Dai, "Conjugated and Fullerene-Containing Polymers for Electronic and Photonic Applications: Advanced Syntheses and Microlithographic Fabrications," Journal of Macromolecular Science, Part C—Reviews in Macromolecular Chemistry and Physics, 39:273-387, 1999.

Kunugi et al., "Charge transport in a regioregular poly(3-octylthiophene) film," J. Mater. Chem., 10:2673-2677, 2000.

Larmat et al., "Comparative Reactivity of Thiophene and 3,4-(Ethylenedioxy) thiophene as Terminal Electropolymerizable Units in Bis-Heterocycle Arylenes," Journal of Polymer Science: Part A: Polymer Chemistry, 35:3627-3636, 1997.

Prato, "Fullerene Materials," Topics in Current Chemistry, 199:173-187, 1999.

Roncali, "Linear π-conjugated systems with tailored electronic properties," Annu. Rep. Prog. Chem., Sect. C, 95:47-88, 1999.

Roncali, "Linear π-conjugated systems derivatized with $C_{60}$-fullerene as molecular heterojunctions for organic photovoltaics," Chem. Soc. Rev., 34:483-495, 2005.

Scherf et al., "Semiconducting Polyfluorenes—Towards Reliable Structure—Property Relationships," Advanced Materials, 14:477-487, 2002.

Subramanian et al., "Trends in Geometric and Electronic Properties of Thiophene- and Cyclopentadiene-Based Polymers," International Journal of Quantum Chemistry, 66:229-240, 1998.

Wang et al., "Conjugated Fluorene and Silole Copolymers: Synthesis, Characterization, Electronic Transition, Light Emission, Photovoltaic Cell, and Field Effect Hole Mobility," Macromolecules, 38:2253-2260, 2005.

Yonezawa et al., "Preparation and properties of oligomers containing cyclopentadithiophene," Synthetic Metals, 119:99-100, 2001.

Zotti et al., "Polymers, Dimers and Radical Cations from Electrochemical Oxidation of Interring-Bridged Thiophene and Thiophene-Phenylene Tetramers," Macromolecular Chemistry and Physics, 202:3049-3056, 2001.

Zotti et al., "Novel, Highly Conducting, and Soluble Polymers from Anodic Coupling of Alkyl-Substituted Cyclopentadithiophene Monomers," Macromolecules, 27:1938-1942, 1994.

Ando et al., "Synthesis, physical properties, and field-effect transistors of novel thiophene/thiazolothiazole co-oligomers," J. Mater. Chem., vol. 14, 1787-1790, 2004.

Jespersen et al., "The electronic states of polyfluorene copolymers with alternating donor-acceptor units," J. Chem. Phy., 121(24):12613-12617, 2004.

Plater et al., "Cyclopenta-1,2,3-dithiazoles and related compounds," J. Chem.. Soc., Perkin Trans. 1, Issue 7, 769-774, 1993. Abstract.

Hiramoto et al., "Effect of Thin Gold Interstitial-layer on the Photovoltaic Properties of Tandem Organic Solar Cell," *Chemistry Letters*, The Chemistry Society of Japan, pp. 327-330, 1990.

Baumgartner, "π-Conjugated Heterocyclic fused Bithiophene Materials," J. Inorganic and Organometallic Polymers and Materials, 15(4):389-409, 2005.

Coppo et al., "New routes to poly(4,4-dialkylcyclopentadithiophene-2,6-diyls)," J. Mater. Chem., 12:2597-2599, 2002.

Muhlbacher et al., "High Photovoltaic Performance of a Low-Bandgap Polymer," Adv. Mater., 18:2884-2889, 2006.

Usta et al., "Dithienosilole- and Dibenzosilole- Thiophene Copolymers as Semiconductors for Organic Thin-Film Transistors," J. Am. Chem., 128:9034-9035, 2006.

Zhu et al., "Panchromatic Conjugated Polymers Containing Alternation Donor/Acceptor Units for Photovoltaic Applications," Macromolecules, 40:1981-1986, 2007.

Bjorstrom et al., "Multilayer formation in spin-coated thin films of low-bandgap polyfluorene:PCBM blends," J. Phys. Condens. Matter 17:L529-L534, 2005.

Drechsel et al., "High efficiency organic solar cells based on single or multiple PIN structures," Thin Solid Films, vol. 451-452:515-517, 2004.

Greenham et al., "Charge separation and transport in conjugated polymer/cadmium selenide nanocrystal composites studied by photoluminescence quenching and photoconductivity," Synthetic Metals, 84:545-546, 1997.

Hiramoto et al., "Design of nanostructures for photoelectric conversion using an organic vertical superlattice," Appl. Phys. Letters, 88:213105, 2006.

Liao et al.,"Photovoltaic Dithienosilole-Containing Polymers," Macromoleculs, vol. 40, pp. 9406-9412 (2007).

Takamoto et al., "Two-Terminal Monolithic In0.5Ga0.5P/GaAs Tandem Solar Cells with a High Conversion Efficiency of Over 30%," Jap. J. Appl. Physics, 36(10):6215-6220.

Umeda et al., "Fabrication of Interpenetrating Semilayered Structure of Conducting Polymer and Fullerene by Solvent Corrosion Method and Its Photovoltaic Properties," Jap. J. Appl. Physics, 44(6A):4155-4160, 2005.

Xue, et al., "Asymmetric tandem organic photovoltaic cells with hybrid planar-mixed molecular heterojunctions," Appl. Phys. Letters, 85(23):5757-5759, 2004.

Yakimov et al., "High photovoltage multiple-heterojunction organic solar cells incorporating interfacial metallic nanoclusters," Applied Physics Letters, vol. 80, No. 9, Mar. 2002.

Yamaguchi et al., "Multi-junction III-V solar cells: current status and future potential," Solar Energy, 79(1):78-85, 2005.

Swager et al., "The molecular wire approach to sensory signal amplifiers," Acc. Chem. Res., 1998, 31, 201-207.

Van Duren, "R.A.J. Low-bandgap Polymer Photovoltaic Cells," Synthetic Metals, 121:1587-1588, 2001.

Zhou et al., "Fluorene based low band gap copolymers for photovoltaic devices," Applied Physics Letters, vol. 84, No. 10, 1653-1655, Mar. 8, 2004.

A. C. Arias, et al., Vertically segregated polymer-blend photovoltaic thin-film structures through surface-mediated solution processing, applied physics letters, vol. 80, No. 10 Mar. 11, 2002.

Anthony M Higgins, et al., "Surface segregation and self-stratification in blends of spin-cast polyfluorene derivatives", J. Phys.: Condens. Matter 17 (2005) 1319-1328.

Hwajeong Kim, et al., "Distinct Annealing Temperature in Polymer:Fullerene:Polymer Ternary Blend Solar Cells", J. Phys. Chem. C, 2009, 113 (4), 1620-1623 DOI: 10.1021/jp809589n, Publication Date (Web): Jan. 5, 2009.

* cited by examiner

FIG. 1

POLYMERS WITH LOW BAND GAPS AND HIGH CHARGE MOBILITY

CROSS REFERENCE TO RELATED APPLICATION

Pursuant to 35 U.S.C. §119(e), this application claims priority to U.S. Provisional Application Ser. No. 60/699,123, filed Jul. 14, 2005, the contents of which are hereby incorporated by reference.

STATEMENT REGARDING FEDERALLY SPONSORED RESEARCH

This invention was supported by contract number W911QY-04-C-0070 awarded by the Defense Advanced Research Projects Agency. The U.S. Government has certain rights in the invention.

TECHNICAL FIELD

This invention generally relates to the field of electron donor materials, as well as related photovoltaic cells.

BACKGROUND OF THE INVENTION

Photovoltaic cells are commonly used to transfer energy in the form of light into energy in the form of electricity. A typical photovoltaic cell includes a photoactive material disposed between two electrodes. Generally, light passes through one or both of the electrodes to interact with the photoactive material. As a result, the ability of one or both of the electrodes to transmit light (e.g., light at one or more wavelengths absorbed by a photoactive material) can limit the overall efficiency of a photovoltaic cell. In many photovoltaic cells, a film of semiconductive material (e.g., indium tin oxide) is used to form the electrode(s) through which light passes because, although the semiconductive material can have a lower electrical conductivity than electrically conductive materials, the semiconductive material can transmit more light than many electrically conductive materials.

SUMMARY

An aspect of the invention relates to a new combination of monomers that produce polymers, wherein the polymers have properties suitable for use as charge carriers in the active layer of a photovoltaic cell.

In one aspect, the invention features a class of co-polymers including at least two co-monomers, at least one of which is a cyclopentadithiophene.

In another aspect, this invention features a photovoltaic cell including a first electrode, a second electrode, and a photoactive material disposed between the first and second electrodes. The photoactive material includes a polymer having a first comonomer repeat unit and a second comonomer repeat unit different from the first comonomer repeat unit. The first comonomer repeat unit includes a cyclopentadithiophene moiety.

In a further aspect, this invention features a polymer that includes a first comonomer repeat unit containing a cyclopentadithiophene moiety, and a second comonomer repeat unit containing a benzothiadiazole moiety, a thiadiazoloquinoxaline moiety, a cyclopentadithiophene dioxide moiety, a cyclopentadithiophene monoxide moiety, a benzoisothiazole moiety, a benzothiazole moiety, a thiophene dioxide moiety, a dihydropentalenothiophene dioxide moiety, a cyclopentadithiophene tetraoxide moiety, or a moiety containing at least three thiophene moieties.

In yet a further aspect, this invention features a polymer that includes a first comonomer repeat unit and a second comonomer repeat unit different from the first comonomer repeat unit. The first comonomer repeat unit contains a cyclopentadithiophene moiety substituted with at least one substituent selected from the group consisting of hexyl, ethylhexyl, dimethyloctyl, $C_1$-$C_{20}$ alkoxy, aryl, heteroaryl, $C_3$-$C_{20}$ cycloalkyl, and $C_3$-$C_{20}$ heterocycloalkyl.

Embodiments can include one or more of the following features.

The cyclopentadithiophene moiety is substituted with at least one substituent selected from the group consisting of $C_1$-$C_{20}$ alkyl, $C_1$-$C_{20}$ alkoxy, aryl, heteroaryl, $C_3$-$C_{20}$ cycloalkyl, and $C_3$-$C_{20}$ heterocycloalkyl. Examples of $C_1$-$C_{20}$ alkyl can be hexyl, 2-ethylhexyl, or 3,7-dimethyloctyl.

The cyclopentadithiophene moiety can be substituted at 4-position.

The first comonomer repeat unit can include a cyclopentadithiophene moiety of formula (I):

(I)

in which each of $R_1$ and $R_2$, independently, is H, $C_1$-$C_{20}$ alkyl, $C_1$-$C_{20}$ alkoxy, aryl, heteroaryl, $C_3$-$C_{20}$ cycloalkyl, or $C_3$-$C_{20}$ heterocycloalkyl. In some embodiments, each of $R_1$ and $R_2$, independently, is hexyl, 2-ethylhexyl, or 3,7-dimethyloctyl. In some embodiments, one of $R_1$ and $R_2$ is hexyl, ethylhexyl, dimethyloctyl, $C_1$-$C_{20}$ alkoxy, aryl, heteroaryl, $C_3$-$C_{20}$ cycloalkyl, or $C_3$-$C_{20}$ heterocycloalkyl, the other of $R_1$ and $R_2$ is H, $C_1$-$C_{20}$ alkyl, $C_1$-$C_{20}$ alkoxy, aryl, heteroaryl, $C_3$-$C_{20}$ cycloalkyl, or $C_3$-$C_{20}$ heterocycloalkyl.

The second comonomer repeat unit can include a benzothiadiazole moiety, a thiadiazoloquinoxaline moiety, a cyclopentadithiophene dioxide moiety, a cyclopentadithiophene monoxide moiety, a benzoisothiazole moiety, a benzothiazole moiety, a thiophene dioxide moiety, or a cyclopentadithiophene tetraoxide moiety. In some embodiments, the second comonomer repeat unit can include a 3,4-benzo-1,2,5-thiadiazole moiety.

The second comonomer repeat unit can include a benzothiadiazole moiety of formula (II), a thiadiazoloquinoxaline moiety of formula (III), a cyclopentadithiophene dioxide moiety of formula (IV), a cyclopentadithiophene monoxide moiety of formula (V), a benzoisothiazole moiety of formula (VI), a benzothiazole moiety of formula (VII), a thiophene dioxide moiety of formula (VIII), a cyclopentadithiophene dioxide moiety of formula (IX), or a cyclopentadithiophene tetraoxide moiety of formula (X):

(II)

-continued (III)

(IV)

(V)

(VI)

(VII)

(VIII)

(IX)

(X)

in which each of $R_1$, $R_2$, and $R_3$, independently, is H, $C_1$-$C_{20}$ alkyl, $C_1$-$C_{20}$ alkoxy, aryl, heteroaryl, $C_3$-$C_{20}$ cycloalkyl, or $C_3$-$C_{20}$ heterocycloalkyl. In some embodiments, the second comonomer repeat unit can include a benzothiadiazole moiety of formula (II). In certain embodiments, $R_1$ and $R_2$ is H.

The second comonomer repeat unit can include at least three thiophene moieties. In some embodiments, at least one of the thiophene moieties is substituted with at least one substituent selected from the group consisting of $C_1$-$C_{20}$ alkyl, $C_1$-$C_{20}$ alkoxy, aryl, heteroaryl, $C_3$-$C_{20}$ cycloalkyl, and $C_3$-$C_{20}$ heterocycloalkyl. In certain embodiments, the second comonomer repeat unit includes five thiophene moieties.

The polymer can further include a third comonomer repeat unit that contains a thiophene moiety or a fluorene moiety. In some embodiments, the thiophene or fluorene moiety is substituted with at least one substituent selected from the group consisting of $C_1$-$C_{20}$ alkyl, $C_1$-$C_{20}$ alkoxy, aryl, heteroaryl, $C_3$-$C_{20}$ cycloalkyl, and $C_3$-$C_{20}$ heterocycloalkyl.

The photoactive material can further include an electron acceptor material. In some embodiments, the electron acceptor material can be a fullerene (e.g., C61-phenyl-butyric acid methyl ester, PCBM).

The polymer and the electron acceptor material each can have a LUMO energy level. The LUMO energy level of the polymer can be at least about 0.2 eV (e.g., at least about 0.3 eV) less negative than the LUMO energy level of the electron acceptor material.

Embodiments can provide one or more of the following advantages.

In some embodiments, using a cyclopentadithiophene moiety can be advantageous because the cyclopentadithiophene moiety can contribute to a shift in the maximum absorption wavelength toward the red or near IR region of the electromagnetic spectrum. When such a polymer is incorporated into a photovoltaic cell, the current and efficiency of the cell can increase.

In some embodiments, a polymer fullerene cell containing a polymer described above can have a band gap that is relatively ideal for its intended purposes.

In some embodiments, a photovoltaic cell having high cell voltage can be created, whereby the HOMO level of the polymer is at least about 0.2 electron volts more negative relative to the LUMO or conduction band of an electron acceptor material.

In some embodiments, a photovoltaic cell containing a polymer described above can have relatively fast and efficient transfer of an electron to an electron acceptor material, whereby the LUMO of the donor is at least about 0.2 electron volt (e.g., at least about 0.3 electron volt) less negative than the conduction band of the electron acceptor material.

In some embodiments, a photovoltaic cell containing a polymer described above can have relatively fast charge separation, whereby the charge mobility of the positive charge, or hole, is relatively high and falls within the range of $10^{-4}$ to $10^{-1}$ cm$^2$/Vs.

In some embodiments, the polymer is soluble in an organic solvent and/or film forming.

In some embodiments, the polymer is optically non-scattering.

In some embodiments, the polymer can be used in organic field effect transistors and OLEDs.

Other features and advantages of the invention will be apparent from the description, drawings, and claims.

DESCRIPTION OF DRAWING

Like reference symbols in the various drawings indicate like elements.

DETAILED DESCRIPTION

Figure 1:
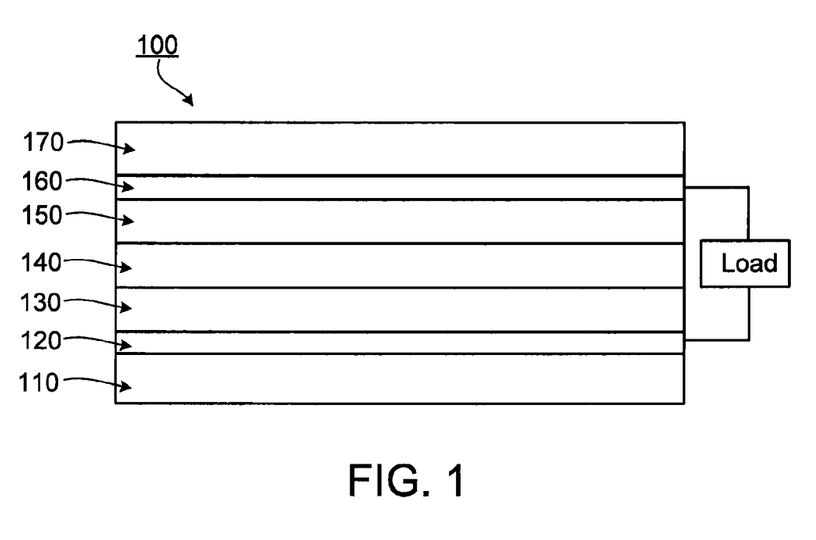
FIG. 1 is a cross-sectional view of an embodiment of a photovoltaic cell.

FIG. 1 shows a cross-sectional view of a photovoltaic cell 100 that includes a substrate 110, a cathode 120, a hole carrier layer 130, an active layer 140 (containing an electron acceptor material and an electron donor material), a hole blocking layer 150, an anode 160, and a substrate 170.

In general, during use, light impinges on the surface of substrate 110, and passes through substrate 110, cathode 120, and hole carrier layer 130. The light then interacts with active layer 140, causing electrons to be transferred from the electron donor material (e.g., a polymer described above) to the electron acceptor material (e.g., PCBM). The electron acceptor material then transmits the electrons through hole blocking layer 150 to anode 160, and the electron donor material transfers holes through hole carrier layer 130 to cathode 120. Anode 160 and cathode 120 are in electrical connection via an external load so that electrons pass from anode 160, through the load, and to cathode 120.

Electron acceptor materials of active layer 140 can include fullerenes. In some embodiments, active layer 140 can include one or more unsubstituted fullerenes and one or more substituted fullerenes. Examples of unsubstituted fullerenes include $C_{60}$, $C_{70}$, $C_{76}$, $C_{78}$, $C_{82}$, $C_{84}$, and $C_{92}$. Examples of substituted fullerenes include PCBM. Other components in photovoltaic cell are known in the art, such as those described in U.S. patent application Ser. No. 10/723,554, the contents of which are incorporated herein by references.

Electron donor materials of active layer 140 can include polymers, such as co-polymers including at least two co-monomers of differing structures. Table 1 lists examples of the first co-monomer, which can be an electron donor and can serve as a conjugative link. Table 2 lists examples of the second co-monomer, which can be an electron withdrawing monomer. Referring to Tables 1 and 2, $R_1$ and $R_2$, independently, can be alkyl, alkoxy, phenyl, or substituted phenyl.

TABLE 1

TABLE 2

An alkyl can be saturated or unsaturated and branch or straight chained. A $C_1$-$C_{20}$ alkyl contains 1 to 20 carbon atoms (e.g., one, two, three, four, five, six, seven, eight, nine, 10, 11, 12, 13, 14, 15, 16, 17, 18, 19, and 20 carbon atoms). Examples of alkyl moieties include —$CH_3$, —$CH_2$—, —$CH_2$=$CH_2$—, —$CH_2$—$CH$=$CH_2$, and branched —$C_3H_7$. An alkoxy can be branch or straight chained and saturated or unsaturated. An $C_1$-$C_{20}$ alkoxy contains an oxygen radical and 1 to 20 carbon atoms (e.g., one, two, three, four, five, six, seven, eight, nine, 10, 11, 12, 13, 14, 15, 16, 17, 18, 19, and 20 carbon atoms). Examples of alkoxy moieties include —$OCH_3$ and —$OCH$=$C_2H_4$. A cycloalkyl can be either saturated or unsaturated. A $C_3$-$C_{20}$ cycloalkyl contains 3 to 20 carbon atoms (e.g., three, four, five, six, seven, eight, nine, 10, 11, 12, 13, 14, 15, 16, 17, 18, 19, and 20 carbon atoms). Examples of cycloalkyl moieities include cyclohexyl and cyclohexen-3-yl. A heterocycloalkyl can also be either saturated or unsaturated. A $C_3$-$C_{20}$ heterocycloalkyl contains at least one ring heteroatom (e.g., O, N, and S) and 3 to 20 carbon atoms (e.g., three, four, five, six, seven, eight, nine, 10, 11, 12, 13, 14, 15, 16, 17, 18, 19, and 20 carbon atoms). Examples of heterocycloalkyl moieties include 4-tetrahydropyranyl and 4-pyranyl. An aryl can contain one or more aromatic rings. Examples of aryl moieties include phenyl, phenylene, naphthyl, naphthylene, pyrenyl, anthryl, and phenanthryl. A heteroaryl can contain one or more aromatic rings, at least one of which contains at least one ring heteroatom (e.g., O, N, and S). Examples of heteroaryl moieties include furyl, furylene, fluorenyl, pyrrolyl, thienyl, oxazolyl, imidazolyl, thiazolyl, pyridyl, pyrimidinyl, quinazolinyl, quinolyl, isoquinolyl, and indolyl.

Alkyl, alkoxy, cycloalkyl, heterocycloalkyl, aryl, and heteroaryl mentioned herein include both substituted and unsubstituted moieties, unless specified otherwise. Examples of substituents on cycloalkyl, heterocycloalkyl, aryl, and heteroaryl include $C_1$-$C_{20}$ alkyl, $C_3$-$C_{20}$ cycloalkyl, $C_1$-$C_{20}$ alkoxy, aryl, aryloxy, heteroaryl, heteroaryloxy, amino, $C_1$-$C_{10}$ alkylamino, $C_1$-$C_{20}$ dialkylamino, arylamino, diarylamino, hydroxyl, halogen, thio, $C_1$-$C_{10}$ alkylthio, arylthio, $C_1$-$C_{10}$ alkylsulfonyl, arylsulfonyl, cyano, nitro, acyl, acyloxy, carboxyl, and carboxylic ester. Examples of substituents on alkyl include all of the above-recited substituents except $C_1$-$C_{20}$ alkyl. Cycloalkyl, heterocycloalkyl, aryl, and heteroaryl also include fused groups.

Table 3 lists two exemplary polymers described in the Summary section above. These polymers can have unique properties, which make them particularly suitable as charge carriers in the active layer of a photovoltaic cell. These properties can be obtained by methods known in the art.

TABLE 3

Generally, one co-monomer in the polymers described in the Summary section above is a cyclopentadithiophene. An advantage of a co-polymer containing a cyclopentadithiophene moiety is that its absorption wavelength can shift toward the red and near IR portion (e.g., 650-800 nm) of the electromagnetic spectrum, which is not accessible by most other polymers. When such a co-polymer is incorporated into a photovoltaic cell, it enables the cell to absorb the light in this region of the spectrum, thereby increasing the current and efficiency of the cell.

The polymers described above can be useful in solar power technology because the band gap is close to ideal for a photovoltaic cell (e.g., a polymer-fullerene cell). The HOMO level of the polymers can be positioned correctly relative to the LUMO of an electron acceptor (e.g., PCBM) in a photovoltaic cell (e.g., a polymer-fullerene cell), allowing for high cell voltage. The LUMO of the polymers can be positioned correctly relative to the conduction band of the electron acceptor in a photovoltaic cell, thereby creating efficient transfer of an electron to the electron acceptor. For example, using a polymer having a band gap of about 1.4-1.6 eV can significantly enhance cell voltage. Cell performance, specifically efficiency, cam benefit from both an increase in photocurrent and an increase in cell voltage, and can approach and even exceed 15% efficiency. The positive charge mobility of the polymers can be relatively high and approximately in the range of $10^{-4}$ to $10^{-1}$ cm$^2$/Vs. In general, the relatively high positive charge mobility allows for relatively fast charge separation. The polymers can also be soluble in an organic solvent and/or film forming. Further, the polymers can be optically non-scattering.

The following examples are illustrative and not intended to be limiting.

Example 1

Synthesis of 4,4-Dihexyl-4H-cyclopenta[2,1-b;3,4-b']dithiophene

4H-Cyclopenta[2,1-b;3,4-b']dithiophene was synthesized according to literature procedure illustrated in Coppo P., Cupertino, D. C., Yeates S. G., and Turner, M. L. *Macromolecules* 2003, 36, 2705-2711. All other starting materials were purchased from Sigma-Aldrich and used as received.

4H-Cyclopenta[2,1-b;3,4-b']dithiophene (1.5 g, 0.00843 mol) was dissolved in DMSO (50 mL). The solution was purged with nitrogen, and grounded KOH (1.89 g, 0.0337 mol) and sodium iodide (50 mg) were added, followed by hexyl bromide (3.02 g, 0.0169 mol). The reaction was stirred for 17 h under nitrogen at room temperature. Water was added and the reaction was extracted with t-butyl-methyl ether. The organic layer was separated and dried over magnesium sulfate. Solvent was removed under vacuum and the residue was purified by chromatography using hexanes as eluent. Fractions containing pure 4,4-dixeyl-4H-cyclopenta[2,1-b;3,4-b'] dithiophene product were combined and the solvents evaporated. The product was obtained as a colorless oil. Yield: 2.36 g (81%).

Example 2

The Synthesis of 4,4-Dihexyl-2,6-bis-trimethylstannanyl-4H-cyclopenta[2,1-b;3,4-b']dithiophene

Starting material 4,4-dihexyl-4H-cyclopenta[2,1-b;3,4-b'] dithiophene (1.5 g, 0.00433 mol) was dissolved in dry THF (30 mL). The solution was cooled to −78° C. and butyl lithium (6.1 mL, 0.0130 mol) was added drop wise. The reaction was stirred at this temperature for 2 h and warmed to room temperature, stirred for 3 h. Again reaction was cooled to −78° C. and trimethyltin chloride (1 M in hexanes, 16.0 mL, 16.0 mmol) was added dropwise. The reaction was allowed to warm to rt and stirred for 17 h. Water was added and the reaction was extracted with toluene. The organic layer was washed with water and dried over sodium sulfate. Solvent was removed under vacuum and the residue was dissolved in toluene, and quickly passed through a plug of silica gel pretreated with triethyl amine. Solvent was removed and the residue dried under vacuum to afford 2.65 g of the bis(trimethyltin) monomer. $^1$H NMR (CDCl$_3$, 200 MHz): 6.97 (m, 2H), 1.84 (m, 4H), 1.20 (m, 16H), 0.88 (m, 6H), 0.42 (m, 18H).

Example 3

The Synthesis of bis-(tributylstannyl)-4,4-dihexyl-cyclopenta[2,1-b:3,4-b']dithiophene

-continued 4,4-Dihexyl-4H-cyclopenta[2,1-b;3,4-b']dithiophene (2.2 g, 0.0065 mol) was dissolved in dry THF (20 mL). The solution was cooled to −78° C. BuLi (7.62, 2.5 M in hexanes, 0.019 mol) was then added to the solution. The reaction mixture was allowed to warm to room temperature and was stirred for 5 hours. The mixture was then cooled again to −78° C. and Bu$_3$SnCl (7.44 g, 0.0229 mol) was added. The reaction mixture was allowed to warm to room temperature and was stirred for another 48 hours. Water was then added and the mixture was extracted with dihicholomethane. Organic layer was collected, dried over anhydrous Na$_2$SO$_4$, and concentrated. The residue thus obtained was dissolved in hexane and quickly passed through a plug of silica gel pretreated with triethylamine. The solvent was removed and the residue was dried under vacuum to afford bis-(tributylstannyl)-4,4-dihexyl-cyclopenta[2,1-b: 3,4-b']dithiophene (5.7 g).

Example 4

Polymerization of bis-(tributylstannyl)-4,4-dihexyl-cyclopenta[2,1-b:3,4-b']dithiophene and 4,7-dibromo-2,1,3-benzothiadiazole Bis-(tributylstannyl)-4,4-dihexyl-cyclopenta[2,1-b:3,4-b']dithiophene (0.775 g, 0.000816 mol) and 4,7-dibromo-2,1,3-benzothiadiazole (0.24 g, 0.000816 mol) were first dissolved in toluene. After the reaction was purged with nitrogen, palladium tretakistriphenylphosphine (15 mg, 0.0065 mmol) was added. The reaction mixture was heated at 100° C. for 24 hour. After the solvent was removed, the residue was washed with acetone and extracted in a Soxlet extractor for 8 hours to afford the product as an insoluble blue solid.

Example 5

Synthesis of 4,4-Bis-(2-ethyl-hexyl)-4H-cyclopenta[2,1-b;3,4-b']dithiophene 4H-Cyclopenta[2,1-b;3,4-b']dithiophene (1.5 g, 0.00843 mol) was dissolved in DMSO (50 mL). After the solution was purged with nitrogen, and grounded KOH (1.89 g, 0.0337 mol), sodium iodide (50 mg), and 2-ethylhexyl bromide (3.25 g, 0.0169 mol) were sequentially added. The reaction mixture was stirred overnight under nitrogen (c.a. 16 hours). Water was added and the reaction was extracted with t-butylmethyl ether. The organic layer was collected, dried over magnesium sulfate, and concentrated. The residue was purified by chromatography using hexanes as eluent. Fractions containing pure 4,4-Bis-(2-ethyl-hexyl)-4H-cyclopenta[2,1-b;3,4-b']dithiophene product were combined and concentrated. The product was obtained as a colorless oil after drying under vacuum. Yield: 2.68 g (79%). $^1$H NMR (CDCl$_3$, 250 MHz): 7.13 (m, 2H), 6.94 (m, 2H), 1.88 (m, 4H), 0.94 (m, 16H), 0.78 (t, 6.4 Hz, 6H), 0.61 (t, 7.3 Hz, 6H).

Example 6

Synthesis of 4,4-Bis-(2-ethyl-hexyl)-2,6-bis-trimethylstannanyl-4H-cyclopenta[2,1-b;3,4-b']dithiophene Starting material 4,4-Bis-(2-ethyl-hexyl)-4H-cyclopenta[2,1-b;3,4-b']dithiophene (1.5 g, 0.00372 mol) was dissolved in dry THF (20 mL). After the solution was cooled to −78° C., butyl lithium (5.21 mL, 0.0130 mol) was added dropwise. The reaction mixture was stirred at this temperature for 1 hour. It was then warmed to room temperature and stirred for another 3 hours. The mixture was again cooled to −78° C. and trimethyltin chloride (1 M in hexane, 15.6 mL, 15.6 mmol) was added dropwise. The reaction mixture was allowed to warm to room temperature and stirred overnight (c.a. 16 hours).

Water was added and the reaction was extracted with toluene. The organic layer was washed with water, dried over sodium sulfate, and concentrated. The residue was dissolved in toluene, and quickly passed through a small plug of silica gel pretreated with triethylamine. The solvent was removed and the residue was dried under vacuum. 1.25 g of the product was obtained. $^1$H NMR (CDCl$_3$, 250 MHz): 6.96 (m, 2H), 1.85 (m, 4H), 1.29 (m, 2H), 0.92 (m, 16H), 0.78 (t, 6.8 Hz, 6H), 0.61 (t, 7.3 Hz, 6H), 0.38 (m, 18H).

Example 7

Polymerization of Bis-(trimethylstannyl)-4,4-Di(2-ethylhexyl)-cyclopenta[2,1-b:3,4-b']dithiophen and 4,7-dibromo-2,1,3-benzothiadiazole Bis-(trimethylstannyl)-4,4-di(2-ethylhexyl)-cyclopenta[2,1-b:3,4-b']dithiophene (0.686 g, 0.000943 mol) and 4,7-dibromo-2,1,3-benzothiadiazole (0.269 g, 0.000915 mol) were dissolved in toluene (20 mL). After the reaction was purged with nitrogen, tris(dibenzylideneacetone)dipalladium(0) (25.1 mg, 0.0275 mmol) and triphenylphosphine (57.6 mg, 0.220 mmol) were added. The reaction was further purged with nitrogen for 10 minutes and heated to 120° C. under nitrogen for 24 hours. The solvent was removed under vacuum and the residue was dissolved in chloroform. After the mixture was poured into methanol (500 mL), the blue precipitate thus obtained was collected by filtration, washed with methanol, and dried. The precipitate was dissolved in chloroform (30 mL) under heating, and filtered through a 0.45 μm membrane. The solution was loaded on to recycling HPLC (2H+2.5H column on a Dychrome recycling HPLC, 5 cycles for each injection), in 3 mL portions for purification. Higher-molecular-weight fractions were combined to give 120 mg pure polymer (Mn=35 kDa).

Example 8

Copolymerization of 4,4-Dihexyl-2,6-bis-trimethyl-stannanyl-4H-cyclopenta[2,1-b;3,4-b']dithiophene, 4,4-Bis-(2-ethyl-hexyl)-2,6-bis-trimethylstannanyl-4H-cyclopenta[2,1-b;3,4-b']dithiophene, and 4,7-Dibromo-benzo[1,2,5]thiadiazole

4,4-Dihexyl-2,6-bis-trimethylstannanyl-4H-cyclopenta[2,1-b;3,4-b']dithiophene (0.0863 g, 0.000128 mol),4,4-bis-(2-ethyl-hexyl)-2,6-bis-trimethylstannanyl-4H-cyclopenta[2,1- b;3,4-b']dithiophene (0.187 g, 0.000257 mol), and 4,7-Dibromo-benzo[1,2,5]thiadiazole (0.111 g, 0.000378 g) were dissolved in toluene (15 mL) and the solution was degassed and purged with $N_2$. Tris(dibenzylideneacetone)dipalladium (0) (6.78 mg, 0.0074 mmol) and triphenylphosphine (15.5 mg, 0.0593 mmol) were then added. The reaction was purged again with nitrogen for 30 minutes and heated at 120° C. under nitrogen. The solvent was then removed under vacuum. The residue was dissolved in chloroform and the solution was added into methanol. The precipitates were collected and extracted with hexane for 24 hours and then extracted with chloroform for 8 hours. The resultant blue solution was concentrated and added to methanol. The precipitates were collected to afford a first fraction of the polymer (70 mg). The remaining materials on the thimble was further extracted with chloroform for 20 hours. 20 mg additional polymer was collected.

Example 9

Preparation of 4H-4,4-bis(2'-ethylhexyl)cyclopenta[2,1-b:3,4-b']thiophene-2,6-bis(pinacolborate) ester

100 mL oven dried Schlenk flask was charged with 1.097 g (2.72 mmol) of 4H-4,4-bis(2'-ethylhexyl)cyclopenta[2,1-b:3,4-b']dithiophene. The flask was evacuated and purged with argon three times. To this flask was then added 20 mL of dry, distilled THF. The resulting solution was cooled to −78° C. and 4.35 mL (10.88 mmol, 4 equv.) of 2.5M BuLi was added dropwise. The reaction was stirred for 1 hout at −78° C. and then warmed to room temperature and stirred for an additional 3 hours. The solution was cooled again to −78° C. and 2.77 mL (13.6 mmol, 5 equiv.) of 2-isopropoxy-4,4,5,5-tetramethyl-1,3,2-dioxaborolane was added in one portion via syringe. The reaction was stirred at −78° C. for 1 hour and then allowed to warm to room temperature overnight. The solution was poured into water and extracted with 4×150 mL of methyl tert-butyl ether. The organic layers were combined and washed with 2×150 mL of brine, dried with anhydrous $MgSO_4$, and filtered. The solvent was removed under vacuum to yield and orange oil, which was purified by column chromatography (5% EtOAc in hexanes) to yield a colorless, viscous oil, 1.34 g (75% yield).

Example 10

Preparation of a Pentathienyl-cyclopentadithiophene Copolymer

-continued

A 50 mL Schlenk flask was charged with 0.309 g (0.472 mmol) of 4H-4,4-bis(2'-ethylhexyl)cyclopenta[2,1-b:3,4-b'] dithiophene-2,6-bis(pinacolborate) ester prepared in Example 9, 0.367 g (0.510 mmol) of 5,5'-dibromo-3",4"-dihexyl-α-pentathiophene (its synthesis was described in WO 2005/092947, which is incorporated herein by reference) 0.0013 g (0.00185 mmol) of $PdCl_2(PPh_3)_2$, and 0.057 g (0.142 mmol) of trioctylmethylammonium chloride (Aliquot 336, Aldrich, St. Louis, Mo.). The flask was fitted with a reflux condenser and the flask was evacuated and refilled with nitrogen three times. The solids were dissolved in 6 mL of toluene and then 0.88 mL of 2M $Na_2CO_3$ were added via syringe. The reaction was then heated to 95° C. with stirring for 5 hours. Phenylboronic acid (0.031 g, 0.250 mmol) and 0.0016 g (0.00228 mmol) of $PdCl_2(PPh_3)_2$ were dissolved in 1 mL of THF and added to the reaction mixture, and stirring was continued for 16 h at 95° C. The reaction mixture was diluted with toluene (50 mL) and the organic layer was separated and washed with warm water (3×50 mL). The solution was then treated with an aqueous solution of diethyldithiocarbamic acid sodium salt trihydrate (7.5%, DDC, 5 mL) and heated at 80° C. overnight. The aqueous layer was separated and discarded and the organic layer was washed with warm water (3×50 mL) and the polymer precipitated into methanol (500 mL). The polymer was collected by filtration, washed with methanol (50 mL) and redissolved in hot toluene (200 mL). The hot polymer solution was passed through a tightly packed column of celite (1×8 cm), silica get (3×8 cm), and basic alumina (3×8 cm) (previously rinsed with 200 mL of hot toluene). The polymer solution was collected and the volume concentrated to approximately 50 mL. The polymer was precipitated into methanol (500 mL), washed with methanol (100 mL), acetone (100 mL) and again with methanol (100 mL). The polymer was then dried in vacuo overnight to yield a brick red material. Yield: 0.327 g.

Example 11

Fabrication of Solar Cell

The polymer solar cells were fabricated by doctor-blading a blend of the polymer prepared in Example 7 (PCPDTBT) and $PC_{61}BM$ or $PC_{71}BM$ (purchased from Nano-C, Westwood, Mass.) in a 1:3 w/w ratio sandwiched between a transparent anode and an evaporated metal cathode. The transparent anode was an indium tin oxide (ITO)-covered glass substrate (Merck, Whitehouse Station, N.J.) which was coated with a ~60 nm thick PEDOT:PSS layer (Baytron PH from H. C. Starck) applied by doctorblading. The ITO-glass-substrate was cleaned by ultrasonification subsequently in acetone, isopropyl alcohol and deionized water. The cathode, a bilayer of a thin (1 nm) LiF layer covered with 80 nm Al, was prepared by thermal evaporation. PCPDTBT and $PC_{61}BM$ or $PC_{71}BM$ were dissolved together in o-dichlorobenzene (ODCB) to give an overall 40 mg/ml solution and was stirred overnight at 60-70° C. inside a glovebox. The active layer thickness, as determined by AFM, was between 150-250 nm. Device characterization was done under AM 1.5 G irradiation (100 mW/cm$^2$) on an Oriel Xenon solar simulator with a well calibrated spectral mismatch of 0.98 jV-characteristics were recorded with a Keithley 2400. Active areas were in the range of 15 to 20 mm$^2$. EQE was detected with a lock-in amplifier under monochromatic illumination. Calibration of the incident light was done with a monocrystalline silicon diode. Mobility measurements were done using an Agilent 4155C parameter analyzer. Absorption measurements were done inside the glovebox with an Avantes fiberoptic spectrometer or outside with a HP spectrometer.

The interaction with PCBM and the photoinduced charge transfer was investigated by PL quenching. The PL of pristine PCPDTBT versus PCPDTBT/PCBM composites was measured at liquid $N_2$ temperatures in a cryostat, excitation was provided by an Ar laser at 488 nm.

Electrochemical experiments were carried out on dropcast polymer films at room temperature in a glovebox. The supporting electrolyte was tetrabutylammonium-hexafluoro-phosphate ($TBAPF_6$, electrochemical grade, Aldrich) ~0.1 M in acetonitrile anhydrous (Aldrich). The working electrode (WE), as well as the counter electrode (CE), was a platinum foil. A silver wire coated with AgCl was used as a reference electrode (RE). After each measurement, the RE was calibrated with ferrocene ($E^0$=400 mV vs. NHE) and the potential axis was corrected to NHE (using −4.75 eV for NHE[24,25]) according to the difference of $E^0$ (ferrocene) and the measured $E^{1/2}$ (ferrocene). $\lambda_{max}$ ($CHCl_3$)=710 nm, $\lambda_{band\ edge}$ ($CHCl_3$)=780 nm, band gap ($CHCl_3$)=1.59 eV, $\lambda_{max}$ (film)= 700-760 nm, $\lambda_{band\ edge}$ (film)=855 nm, band gap (film)=1.45 eV, HOMO=−5.3 eV, −5.7 eV (electrochem), LUMO=−3.85 eV, −4.25 eV, $\mu_+$=2×10$^{-2}$ cm$_2$/Vs (TOF), 1×10$^{-3}$ cm$^2$/Vs (FET).

Other embodiments are in the claims.

The invention claimed is:
1. A photovoltaic cell, comprising:
a first electrode,
a second electrode, and
a photoactive material disposed between the first and second electrodes, the photoactive material comprising a polymer including a first comonomer repeat unit and a second comonomer repeat unit, the first comonomer repeat unit comprising a cyclopentadithiophene moiety of formula (I):

and the second comonomer repeat unit comprising a benzothiadiazole moiety of formula (II):

wherein each of $R_1$ and $R_2$ in formula (I), independently, is H, $C_1$-$C_{20}$ alkyl, $C_1$-$C_{20}$ alkoxy, aryl, heteroaryl, $C_3$-$C_{20}$ cycloalkyl, or $C_3$-$C_{20}$ heterocycloalkyl; and each of $R_1$ and $R_2$ in formula (II), independently, is H, $C_1$-$C_{20}$ alkyl, $C_1$-$C_{20}$ alkoxy, aryl, heteroaryl, $C_3$-$C_{20}$ cycloalkyl, or $C_3$-$C_{20}$ heterocycloalkyl.

2. The photovoltaic cell of claim 1, wherein the cyclopentadithiophene moiety is substituted with at least one substituent selected from the group consisting of $C_1$-$C_{20}$ alkyl, $C_1$-$C_{20}$ alkoxy, aryl, heteroaryl, $C_3$-$C_{20}$ cycloalkyl, and $C_3$-$C_{20}$ heterocycloalkyl.

3. The photovoltaic cell of claim 2, wherein the cyclopentadithiophene moiety is substituted with hexyl, 2-ethylhexyl, or 3,7-dimethyloctyl.

4. The photovoltaic cell of claim 1, wherein each of $R_1$ and $R_2$ in formula (I), independently, is hexyl, 2-ethylhexyl, or 3,7-dimethyloctyl.

5. The photovoltaic cell of claim 1, wherein each of $R_1$ and $R_2$ in formula (II) is H.

6. The photovoltaic cell of claim 1, wherein the polymer comprises a moiety selected from the group consisting of:

and

7. The photovoltaic cell of claim 1, wherein the polymer further comprises a third comonomer repeat unit, the third comonomer repeat unit comprising a thiophene moiety or a fluorene moiety.

8. The photovoltaic cell of claim 7, wherein the thiophene or fluorene moiety is substituted with at least one substituent selected from the group consisting of $C_1$-$C_{20}$ alkyl, $C_1$-$C_{20}$ alkoxy, aryl, heteroaryl, $C_3$-$C_{20}$ cycloalkyl, and $C_3$-$C_{20}$ heterocycloalkyl.

9. The photovoltaic cell of claim 1, wherein the photoactive material further comprises an electron acceptor material.

10. The photovoltaic cell of claim 9, wherein the electron acceptor material comprises a fullerene.

11. The photovoltaic cell of claim 10, wherein the electron acceptor material comprises PCBM.

12. The photovoltaic cell of claim 9, wherein the polymer and the electron acceptor material each has a LUMO energy level, the LUMO energy level of the polymer is at least about 0.2 eV less negative than the LUMO energy level of the electron acceptor material.

13. A polymer, comprising:
a first comonomer repeat unit comprising a cyclopentadithiophene moiety of formula (I):

a second comonomer repeat unit comprising a benzothiadiazole moiety of formula (II):

wherein each of $R_1$ and $R_2$ in formula (I), independently, is H, $C_1$-$C_{20}$ alkyl, $C_1$-$C_{20}$ alkoxy, aryl, heteroaryl, $C_3$-$C_{20}$ cycloalkyl, or $C_3$-$C_{20}$ heterocycloalkyl; and each of $R_1$ and $R_2$ in formula (II), independently, is H, $C_1$-$C_{20}$ alkyl, $C_1$-$C_{20}$ alkoxy, aryl, heteroaryl, $C_3$-$C_{20}$ cycloalkyl, or $C_3$-$C_{20}$ heterocycloalkyl.

14. The polymer of claim 13, wherein the cyclopentadithiophene moiety is substituted with at least one substituent selected from the group consisting of $C_1$-$C_{20}$ alkyl, $C_1$-$C_{20}$ alkoxy, aryl, heteroaryl, $C_3$-$C_{20}$ cycloalkyl, and $C_3$-$C_{20}$ heterocycloalkyl.

15. The polymer of claim 14, wherein the cyclopentadithiophene moiety is substituted with hexyl, 2-ethylhexyl, or 3,7-dimethyloctyl.

16. The polymer of claim 13, wherein each of $R_1$ and $R_2$ in formula (I), independently, is hexyl, 2-ethylhexyl, or 3,7-dimethyloctyl.

17. The polymer of claim 13, wherein each of $R_1$ and $R_2$ in formula (II) is H.

18. The polymer of claim 13, wherein the polymer comprises a moiety selected from the group consisting of:

and

19. The polymer of claim 13, wherein the polymer further comprises a third comonomer repeat unit, the third comonomer repeat unit comprising a thiophene moiety or a fluorene moiety.

20. The polymer of claim 19, wherein the thiophene or fluorene moiety is substituted with at least one substituent selected from the group consisting of $C_1$-$C_{20}$ alkyl, $C_1$-$C_{20}$ alkoxy, aryl, heteroaryl, $C_3$-$C_{20}$ cycloalkyl, and $C_3$-$C_{20}$ heterocycloalkyl.

* * * * *